(12) United States Patent
Yang et al.

(10) Patent No.: US 11,094,767 B2
(45) Date of Patent: Aug. 17, 2021

(54) FLEXIBLE ORGANIC LIGHT EMITTING DIODE DEVICE AND METHOD OF FORMING THE SAME

(71) Applicant: WUHAN CHINA STAR OPTOELECTRONICS SEMICONDUCTOR DISPLAY TECHNOLOGY CO., LTD., Wuhan (CN)

(72) Inventors: Weiwei Yang, Wuhan (CN); Cheng Yang, Wuhan (CN)

( * ) Notice: Subject to any disclaimer, the term of this patent is extended or adjusted under 35 U.S.C. 154(b) by 290 days.

(21) Appl. No.: 16/349,291

(22) PCT Filed: Mar. 22, 2019

(86) PCT No.: PCT/CN2019/079241
§ 371 (c)(1),
(2) Date: May 13, 2019

(87) PCT Pub. No.: WO2020/113857
PCT Pub. Date: Jun. 11, 2020

(65) Prior Publication Data
US 2021/0183981 A1  Jun. 17, 2021

(30) Foreign Application Priority Data

Dec. 5, 2018  (CN) .......................... 201811477096.5

(51) Int. Cl.
*H01L 27/32* (2006.01)
*H01L 51/00* (2006.01)
*H01L 51/56* (2006.01)

(52) U.S. Cl.
CPC ...... *H01L 27/3276* (2013.01); *H01L 27/3246* (2013.01); *H01L 27/3262* (2013.01);
(Continued)

(58) Field of Classification Search
None
See application file for complete search history.

(56) References Cited

U.S. PATENT DOCUMENTS 6,515,428 B1   2/2003  Yeh et al.
10,943,537 B2 * 3/2021  Li ........................ G09G 3/3233
(Continued)

FOREIGN PATENT DOCUMENTS

CN    105355646 A    2/2016
CN    106775173 A    5/2017
(Continued)

*Primary Examiner* — Joe E. Schoenholtz

(57) ABSTRACT

A flexible organic light-emitting diode (OLED) device includes a flexible substrate, a buffer layer, an inorganic layer, a first gate insulating layer, a second gate insulating layer, an inter-layer dielectric layer, a passivation layer, a pixel definition layer, a driving transistor, an OLED, a data voltage lead, and a driving voltage lead. The driving voltage lead is connected to the driving voltage terminal through a first hole which penetrates the second gate insulating layer, the first gate insulating layer, the inorganic layer, and the buffer layer, and through a second hole which penetrates the inter-layer dielectric layer. The data voltage lead and the driving voltage lead are arranged in different layers in a bendable inactive area. Compared with the related art, the layout space is omitted or saved in the present disclosure, which shortens the bezel effectively.

10 Claims, 8 Drawing Sheets

(52) U.S. Cl.
CPC .......... *H01L 51/0097* (2013.01); *H01L 51/56* (2013.01); *H01L 2227/323* (2013.01)

(56) References Cited

U.S. PATENT DOCUMENTS

| | | |
|---|---|---|
| 2017/0338293 A1 | 11/2017 | Guo |
| 2018/0204896 A1 | 7/2018 | Park et al. |
| 2018/0226454 A1 | 8/2018 | Liu et al. |
| 2018/0342707 A1* | 11/2018 | Lee ................... H01L 27/3279 |
| 2019/0164487 A1* | 5/2019 | Lee ................... H01L 27/1218 |
| 2019/0304368 A1* | 10/2019 | Yang ................. H01L 27/3244 |

FOREIGN PATENT DOCUMENTS

| | | |
|---|---|---|
| CN | 106935628 A | 7/2017 |
| CN | 108933162 A | 12/2018 |

\* cited by examiner

FLEXIBLE ORGANIC LIGHT EMITTING DIODE DEVICE AND METHOD OF FORMING THE SAME

BACKGROUND

1. Field of the Disclosure

The present disclosure relates to the field of display technology, and more particularly, to a flexible organic light-emitting diode (OLED) device and a method of forming the flexible OLED device.

2. Description of the Related Art

An organic light-emitting diodes (OLED) can be applied in different areas owing to some advantages such as light weight, self-illumination, wide viewing angles, low driving voltage, high luminous efficiency, low power consumption, and swift response. In particular, a flexible OLED display device is bendable and easily portable so it becomes mainstream development in the field of display technology. A flexible OLED substrate can be bent to the back of the display screen so the bezel of the flexible OLED substrate can be shortened. However, the flexible OLED substrate is currently designed as a circular arc. A power signal in an array structure is laid out in a first metallic layer where a drain and a source (SD) are laid out as well after being taken out from an active area. A data signal is alternately laid out with a dual layer of gate GE1/GE2. The power signal in the bent area of the flexible OLED panel has to be laid out in the first metallic layer as well. This therefore leads to the bezel of the flexible OLED substrate a bit wide. How to shorten the bezel is a technical problem waiting to be solved.

SUMMARY

In view of the problem of the related art, the main object of the present disclosure is to propose a solution, that is, to provide a flexible organic light-emitting diode (OLED) device and a method of forming the flexible OLED device.

According to a first aspect of the present disclosure, a flexible organic light-emitting diode (OLED) device having an active area and an inactive area, comprises a flexible substrate, a buffer layer arranged on the flexible substrate, an inorganic layer, arranged on the buffer layer, a first gate insulating layer arranged on the inorganic layer, a second gate insulating layer arranged on the first gate insulating layer, an inter-layer dielectric (ILD) layer arranged on the second gate insulating layer, a passivation layer arranged on the ILD layer, a pixel definition layer (PDL) arranged on the passivation layer, a driving transistor arranged in the active area, comprising a controlling electrode and an outputting electrode, and configured to receive data voltage and driving voltage, an OLED arranged in the active layer and comprising an anode layer, a cathode layer, and a light-emitting layer, a data voltage lead connected to the controlling electrode of the driving transistor and a driving voltage lead connected to the outputting electrode of the driving transistor and a driving voltage terminal. The data voltage lead arranged on the ILD layer in the inactive area, and the data voltage lead corresponding to a bendable area of the inactive area located on the passivation layer. The driving voltage lead is connected to the driving voltage terminal through a first hole which penetrates the second gate insulating layer, the first gate insulating layer, the inorganic layer, and the buffer layer, and through a second hole which penetrates the ILD layer. the light-emitting layer arranged between the anode layer and the cathode layer and configured to produce light based on a difference between the data voltage and the driving voltage.

According to the present disclosure, the driving transistor further comprises an active layer; the active layer is arranged on the buffer layer; the controlling electrode is arranged on the first gate insulating layer; the outputting electrode is connected to the active layer through a third hole which penetrates the ILD layer, the second gate insulating layer, and the first gate insulating layer.

According to the present disclosure, the anode layer is connected to the outputting electrode through a fourth hole which penetrates passivation layer; the anode layer is configured to receive the driving voltage.

According to the present disclosure, the flexible substrate is fabricated by polyimide (PI).

According to the present disclosure, the inorganic layer may be fabricated from either silicon oxide (SiOx) or silicon nitride (SiNx).

According to a second aspect of the present disclosure, a method of forming a flexible organic light-emitting diode (OLED) device includes: forming a flexible substrate; forming an inorganic layer and a buffer layer on the flexible substrate sequentially; forming an active layer of a driving transistor on the buffer layer; forming a first gate insulating layer on the buffer layer; forming a controlling electrode of the driving transistor on the first gate insulating layer; forming a second gate insulating layer on the first gate insulating layer; etching the buffer layer, the first gate insulating layer, and the second gate insulating layer to form a first hole; etching a first metallic layer to form a first segment of a driving voltage lead; connecting the first segment of the driving voltage lead to a driving voltage terminal through the first hole; forming an inter-layer dielectric (ILD) layer on the second gate insulating layer; etching the ILD layer to form a second hole and the third hole, and etching the first gate insulating layer, the second gate insulating layer and the ILD layer to form a third hole; etching a second metallic layer to form a second segment of the driving voltage lead, a data voltage lead, and an outputting electrode of the driving transistor; connecting the second segment of the driving voltage lead to the first segment of the driving voltage lead through the second hole; connecting the outputting electrode of the driving transistor to the active layer through the third hole; forming a passivation layer on the ILD layer; and forming an OLED on the passivation layer wherein an anode layer of the OLED is connected to the outputting electrode of the driving transistor.

According to the present disclosure, the step of forming the OLED on the passivation layer and connecting the anode layer of the OLED to the outputting electrode comprises: etching the passivation layer to form a fourth hole; etching a third metallic layer of the passivation layer to form the anode layer; connecting the anode layer to the outputting electrode through the fourth hole; forming a pixel definition layer (PDL) on the passivation layer; etching the passivation layer to form a fifth hole; and forming a light-emitting layer of the OLED and a cathode layer of the OLED on the anode layer sequentially.

According to the present disclosure, the step of etching the buffer layer, the first gate insulating layer, and the second gate insulating layer to form the first hole comprises: etching the first gate insulating layer and the second gate insulating layer to form a primary hole; and etching the buffer layer to form a first auxiliary hole, wherein the first hole is formed with the first primary hole and the first auxiliary hole.

According to the present disclosure, the flexible OLED device comprises an active area and an inactive area; the driving transistor and the OLED are arranged in the active area; the driving voltage lead and the data voltage lead are arranged in the inactive area.

According to the present disclosure, the flexible substrate is fabricated by polyimide (PI).

In the flexible OLED device of the present disclosure, a data voltage lead and a driving voltage lead are arranged in different layers in a bendable inactive area. Compared with the related art, the layout space is omitted or saved in the present disclosure, which shortens the bezel effectively.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE EMBODIMENTS

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Figure 1:
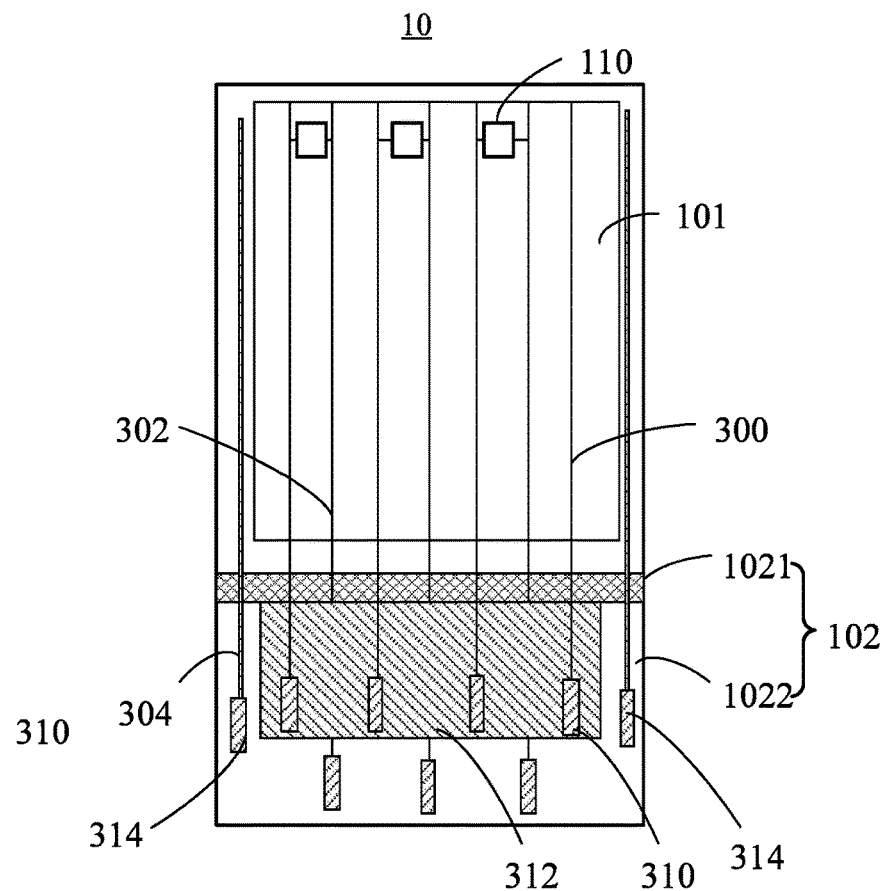
FIG. 1 is a schematic diagram of a flexible organic light-emitting diode (OLED) device according to a first embodiment of the present disclosure.
Figure 2:
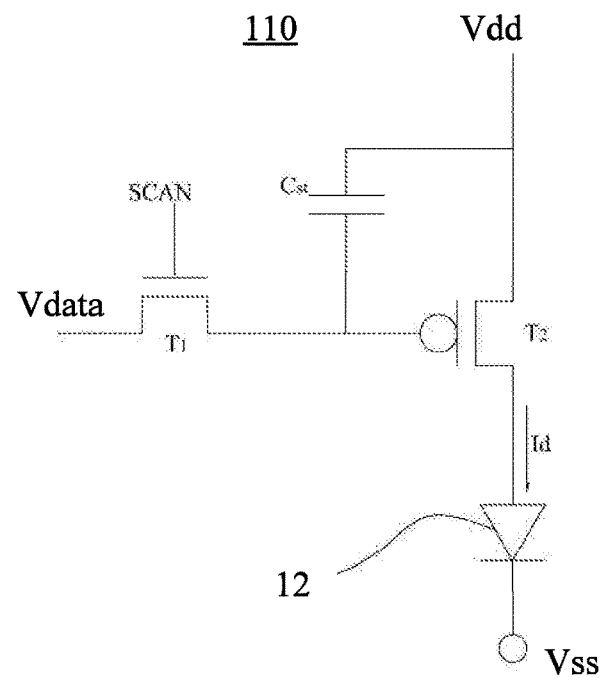
FIG. 2 is a circuit diagram of a pixel circuit in an active area as illustrated in FIG. 1.

Please refer to FIG. 1 and FIG. 2. FIG. 1 is a schematic diagram of a flexible organic light-emitting diode (OLED) device 10 according to a first embodiment of the present disclosure. FIG. 2 is a circuit diagram of a pixel circuit 110 in an active area 101 as illustrated in FIG. 1. The flexible OLED device 10 includes an active area 101 and an inactive area 102. The inactive area 102 includes a bendable area 1021 and a signal pad area 1022. The bendable area 1021 of the flexible OLED device 10 can be bent such that the signal pad area 1022 is arranged on the back of a display screen, so that the bezel can be shortened. A plurality of data voltage leads 300, a plurality of driving voltage leads 302 and 304, a plurality of data transmitting pads 310, and a plurality of driving transmitting pads 312 and 314 are distributed over the signal pad area 1022. The plurality of data voltage leads 300 are connected to the plurality of data transmitting pads 310 one-to-one. The plurality of driving voltage leads 302 and 304 are connected to the plurality of driving transmitting pads 312 and 314 one-to-one. A plurality of pixel circuits 110 are arranged on the active area 101. Each of the plurality of pixel circuits 110 is connected to its corresponding driving voltage leads 302 and 304 and data voltage leads 300. Each of the data transmitting pads 310 is configured to receive data voltage Vdata transmitted by an image processor (not illustrated) and transmit the data voltage Vdata to its corresponding pixel circuit 110 through the data voltage lead 300. The driving transmitting pads 312 and 314 are respectively configured to transmit driving voltage Vdd/Vss at high/low voltage levels. The driving voltages Vdd/Vss are transmitted to their corresponding pixel circuits 110 through the driving voltage leads 302 and 304.

The pixel circuit 110 includes a switching transistor T1, a driving transistor T2, a storage capacitor Cst, and an OLED 12. When scanning signal voltage is transmitted through a scanning terminal SCAN to turn on the switching transistor T1, the data voltage Vdata is sent through the data terminal DATA and transmitted to a gate of the driving transistor T2 through the switching transistor T1. When the driving transistor T2 operates in a saturation regain, a conducting current Id on the driving transistor T2 is determined by the gate voltage and source voltage (Vsg=Vdd−Vdata) across the driving transistor T2, that is, $Id=K(Vsg-Vt)^2=K(Vdd-Vdata-Vt)^2$. Because the light-emitting luminance of the OLED 12 is proportional to the conducting current Id, the OLED 12 adjusts the light-emitting luminance according to the data voltage Vdata so that the corresponding pixels can generate different grayscales. Furthermore, since the data voltage Vdata is stored in the storage capacitor Cst, the luminance on the pixels of the OLED 12 can be retained during changes of the images.

Figure 3:
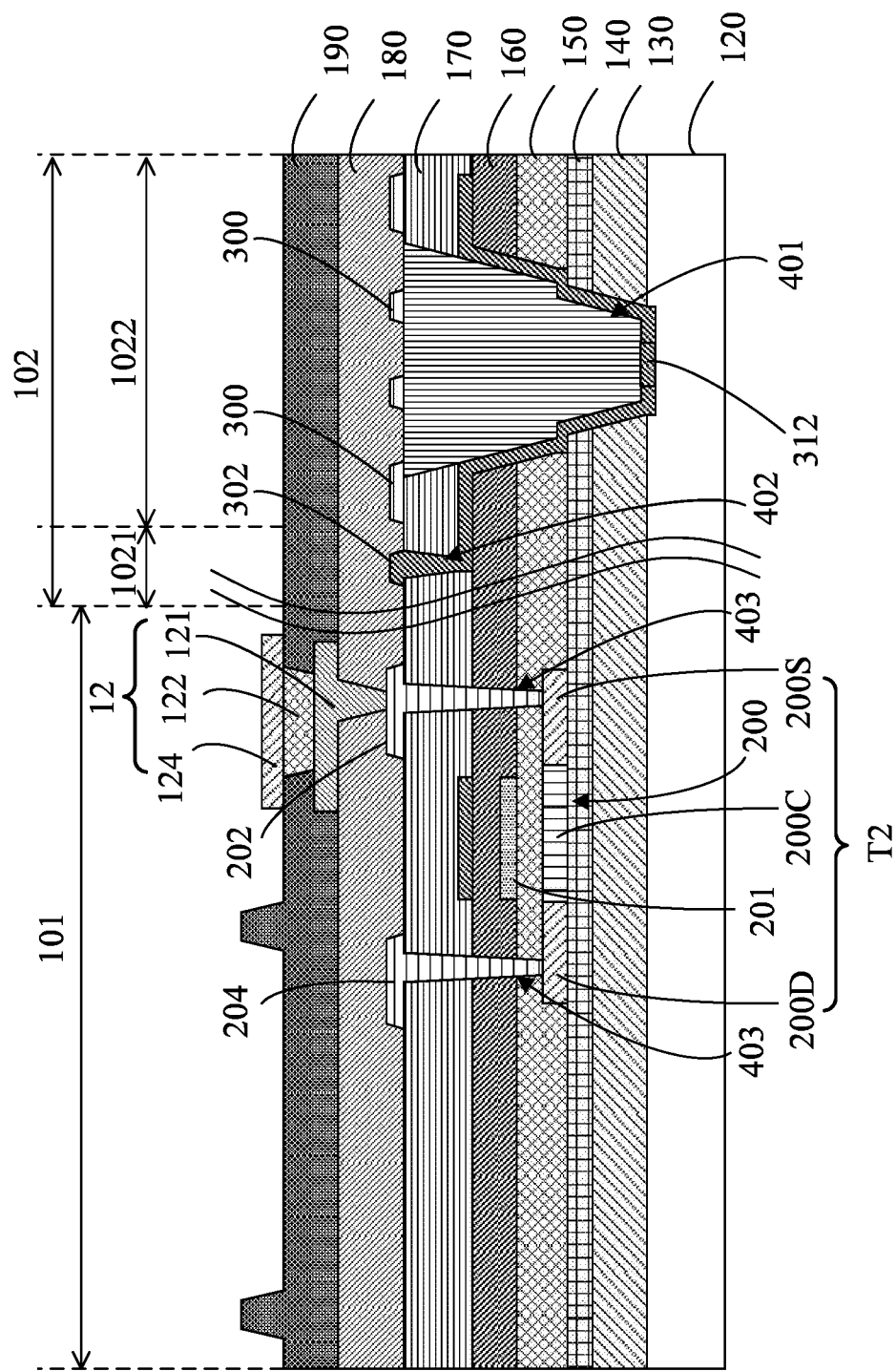
FIG. 3 illustrates a schematic diagram of a flexible OLED device according to the embodiment of the present disclosure.

Please refer to FIG. 3 illustrating a schematic diagram of the flexible OLED device 10 according to the embodiment of the present disclosure. The flexible OLED device 10 includes a flexible substrate 120, an inorganic layer 130, a buffer layer 140, a first gate insulating layer 150, a second gate insulating layer 160, an inter-layer dielectric (ILD) layer 170, and a passivation layer 180, a pixel definition layer 190, and a driving transistor T2. The flexible substrate 120 may be fabricated by bendable insulating material such as polyimide (PI), polycarbonate (PC), polyethersulfone (PES), polyethylene terephthalate (PET), polyethylene naphthalate (PEN), polyarylate (PAR), and glass fiber reinforced plastic (FRP). The inorganic layer 130 and the buffer layer 140 cover the surface of the flexible substrate 120, which is configured to block moisture or impurities, prevent moisture or impurities from diffusing through the flexible substrate 120, and provide a flat surface for the flexible substrate 120. In this embodiment, the inorganic layer 130 and the buffer layer 140 may be films formed by inorganic material such as silicon oxide (SiOx), silicon nitride (SiNx), silicon oxynitride (SiOxNy), aluminum oxide (AlOx), and aluminum nitride (AlNx). The driving transistor T2 may be a thin film transistor (TFT). The driving transistor T2 is arranged on the buffer layer 140. In FIG. 3, a structural description of a top gate TFT is taken as an example. The driving transistor T2 includes a semiconductor active layer 200, a controlling electrode, an inputting electrode, and an outputting electrode. The semiconductor active layer 200, the controlling electrode, the inputting electrode, and the outputting electrode are arranged on the buffer layer 140. The semiconductor active layer 200 includes a source area 200S and a drain area 200D. The source area 200S and the drain area 200D are formed by doping N-type impurity ions or P-type impurity ions. The area between the source area 200S and the drain area 200D is a channel area 200C which is not doped with impurities. The semiconductor active layer 200 can be formed by changing amorphous silicon (a-Si) to polycrystalline silicon by means of crystallization of a-Si. Specifically, a process like rapid thermal annealing (RTA), excimer laser annealing (ELA), solid phase crystallization (SPC), metal induced crystallization (MIC), metal induced lateral crystallization (MILC) process, or continuous lateral solidification (SLS) is implemented to crystallize a-Si. The first gate insulating layer 150 is disposed on the semiconductor active layer 200. The first gate insulating layer 150 may be fabricated by inorganic material such as SiOx, SiNx, and metal oxide, and may include a single-layer film or a plurality of films. The gate 201 (i.e., the controlling electrode of the driving transistor T2) is disposed in a specific area on the first gate insulating layer 150. The gate electrode 201 may include a single layer of or a plurality of layers of gold (Au), silver (Ag), copper (Cu), molybdenum (Mo), nickel (Ni), platinum (Pt), aluminum (Al), or chromium (Cr), or an alloy such as an aluminum (Al)/niobium (Nd) alloy, a molybdenum (Mo)/tungsten (W) alloy, etc. The second gate insulating layer 160 is arranged on the gate 201 and may be fabricated by insulating inorganic material such as SiOx and SiNx. The source 202 and the drain 204 (i.e., the outputting and inputting electrodes of the driving transistor T2) are arranged on the second gate insulating layer 160 and are electrically connected to the source area 200S and the drain area 200D through a third hole 403, respectively. The third hole 403 may be formed by removing the first gate insulating layer 150, the second gate insulating layer 160, and the ILD layer 170.

The passivation layer 180 is arranged on the source 202 and the drain 204. The passivation layer 180 may be fabricated by organic material such as acryl, polyimide (PI), and benzocyclobutene (BCB). The OLED 12 is formed on the transistor T2. The OLED 12 includes an anode layer 121, a light-emitting layer 122, and a cathode layer 124. The anode layer 121 is electrically connected to the source 202 or the drain 204 (i.e., the outputting electrode of the driving transistor T2) through a fifth hole. The anode layer 121 may be formed as a transparent electrode or a reflective electrode according to functions of the anode layer 121. When the anode layer 121 is a transparent electrode, the first electrode may include indium tin oxide (ITO), indium zinc oxide (IZO), zinc oxide (ZnO), or indium oxide (In2O3). When the anode layer 121 is a reflective electrode, the reflective layer may be fabricated by Ag, Mg, Al, Pt, Pd, Au, Ni, Nd, Ir, Cr, or a mixture of Ag, Mg, Al, Pt, Pd, Au, Ni, Nd, Ir, and Cr. Besides, ITO, IZO, ZnO, In2O3, or the like may be formed on the reflective electrode. The pixel definition layer (PDL) 190 is arranged on the passivation layer 180 and covers the edges of the anode layer 121. The PDL 190 may be fabricated by organic material such as PI, polyamide, benzocyclobutene (BCB), acryl resin, and phenol resin. The light-emitting layer 122 is arranged on the anode layer 121. The portion of the light-emitting layer 122 above the anode layer 121 is not covered by the PDL 190; that is, the portion of the light-emitting layer 122 above the anode layer 121 is exposed. The size of the light-emitting layer 122 is the displaying area of the pixel. The light-emitting layer 122 may be formed in a vapor deposition process and may be formed by low molecular organic material or high molecular organic material. The light-emitting layer 122 includes an organic emitting layer and may further include any one of a hole injection layer (HIL), a hole transport layer (HTL), an electron transport layer (ETL), and an electron injection layer (EIL). The cathode layer 124 is arranged on the light-emitting layer 122. Similar to the anode layer 121, the cathode layer 124 may be formed as a transparent electrode or a reflective electrode. The anode layer 121 and the cathode layer 124 are insulated from each other by the light-emitting layer 122. The light-emitting layer 122 emits visible light based on the difference of voltage imposed on the anode layer 121 and voltage imposed on the cathode layer 124, thereby making it come true that images can be recognized by users. Specifically, the cathode layer 124 can be formed as a transparent electrode or a reflective electrode. When the cathode layer 124 is a transparent electrode, it may be fabricated by lithium (Li), calcium (Ca), lithium fluoride/calcium (LiF/Ca), lithium fluoride/aluminum (LiF/Al), aluminum (Al), magnesium (Mg), or a compound of Li, Ca, LiF/Ca, Al, and Mg. Besides, the cathode layer 124 may be initially deposited on the light-emitting layer by evaporation. When the cathode layer 124 is a reflective electrode, it may be Li, Ca, LiF/Ca, LiF/Al, Al, Mg, or a compound of Li, Ca, LiF/Ca, LiF/Al, Al, and Mg.

In the present embodiment, the data voltage lead 300 (as well as the source 202 or the drain 204 simultaneously formed on the second metallic layer) is connected to the gate 201 of the driving transistor T2 and configured to transmit the data voltage Vdata. Within the scope of the inactive area 102, the data voltage lead 300 is arranged on the ILD layer 170. The driving voltage lead 302 (formed by the first metallic layer) is connected to the source 202 or the drain 204 of the driving transistor T2 (i.e., the outputting electrode of the driving transistor T2) and the driving transmitting pad 312 and configured to receive the driving voltage Vdd. In the range of the inactive area 120, the driving voltage lead 302 is connected to the driving transmitting pad 312 through a first hole 401 which penetrates the second gate insulating layer 160, the first gate insulating layer 150, the inorganic layer 130, and the buffer layer 120, and through the second hole 402 which penetrates the ILD layer 170.

Please refer to FIG. 1 and FIG. 3. The data voltage lead 300 is arranged on not only the ILD layer 170 in the active area 101 but also the ILD layer 170 in the inactive area 102, but the driving voltage lead 302 is stretched and bent onto the flexible substrate 120 in the inactive area 102. With the configuration of the present embodiment, the driving voltage lead 302 and the data voltage lead 300 are disposed in different layers within the range of the inactive area 102. In the related art, the data voltage lead and the driving voltage lead must be disposed on the same layer in the range of the inactive area. However, in the present disclosure, the data voltage lead and the driving voltage lead are disposed on different layers in the range of the inactive area. Therefore, the layout space is omitted and saved, thereby shortening the bezel greatly. On the other hand, the driving voltage lead 302 is connected to the driving transmitting pad 312 to reduce the impact of a voltage drop (IR drop) because the driving transmitting pad 312 is disposed on the flexible substrate 120 of the inactive area 102 and because the driving transmitting pad 312 is a whole piece of metal.

Figure 4:
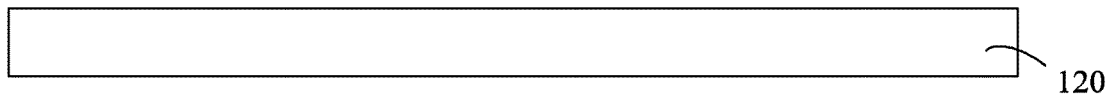
FIG. 4 to FIG. 17 illustrate a method of forming a flexible organic light-emitting diode (OLED) device as illustrated in FIG. 3 according a second embodiment of the present disclosure.
Figure 5:
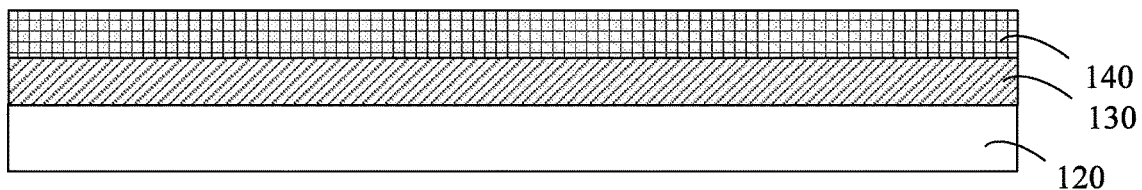
Figure 6:
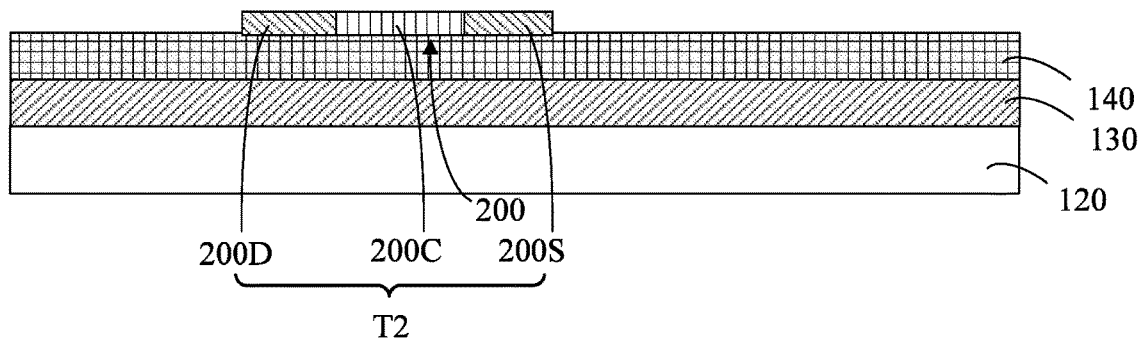
Figure 7:
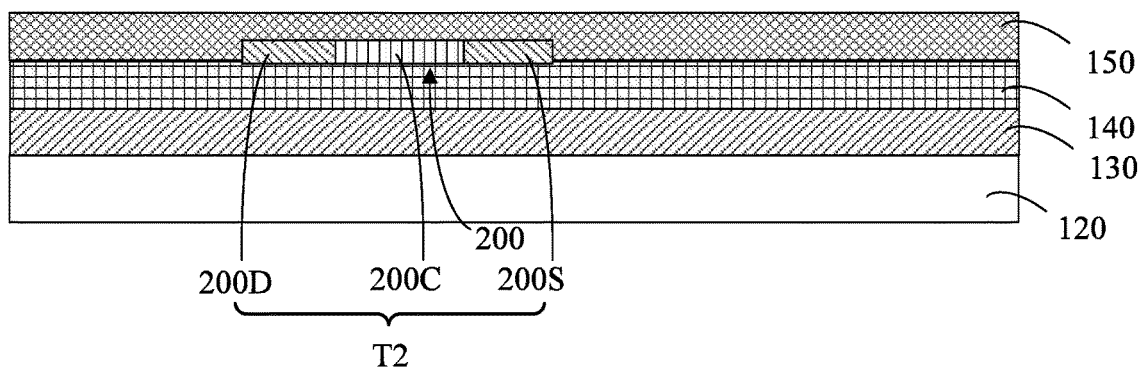
Figure 8:
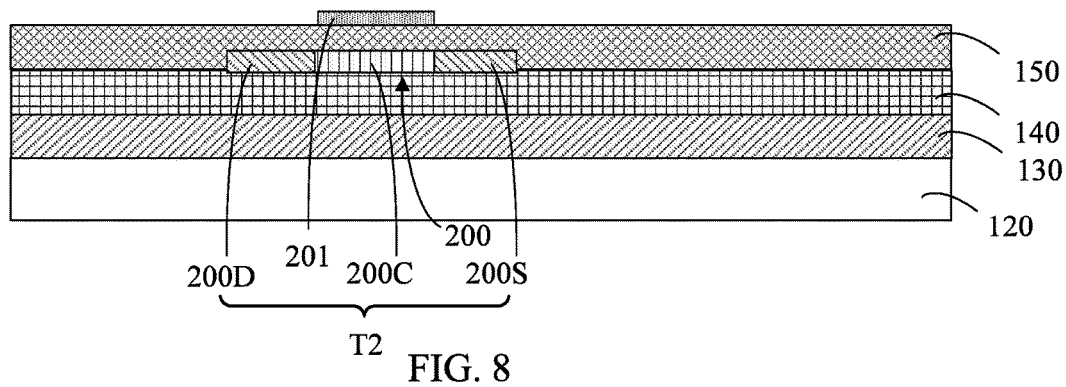
Figure 9:
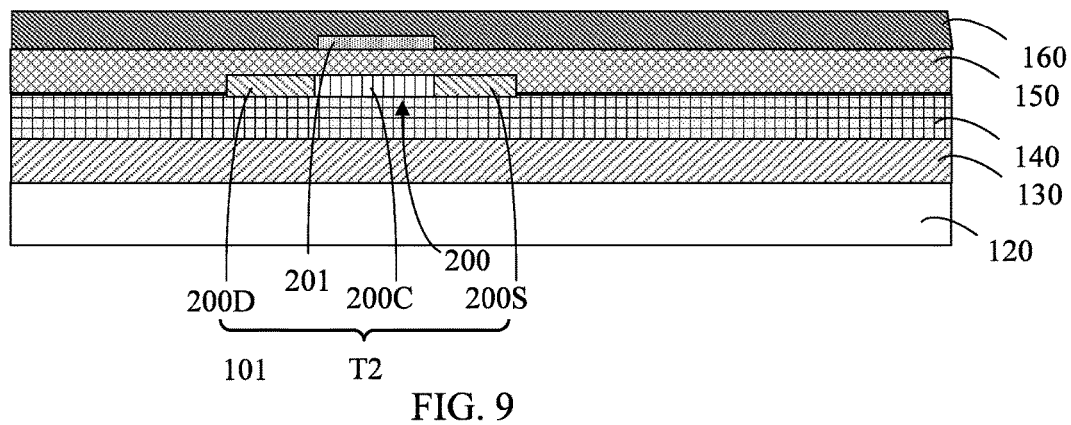
Figure 10:
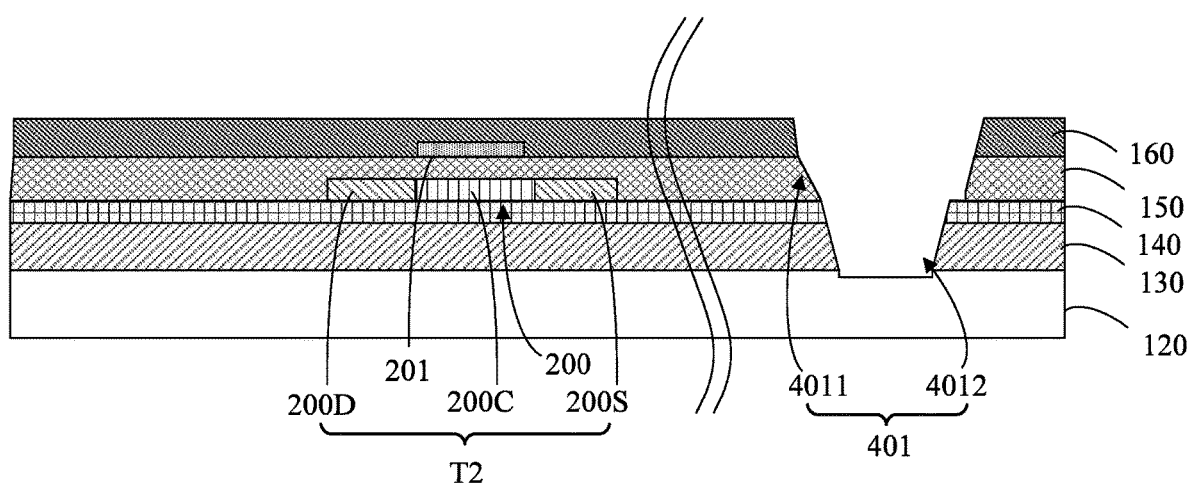
Figure 11:
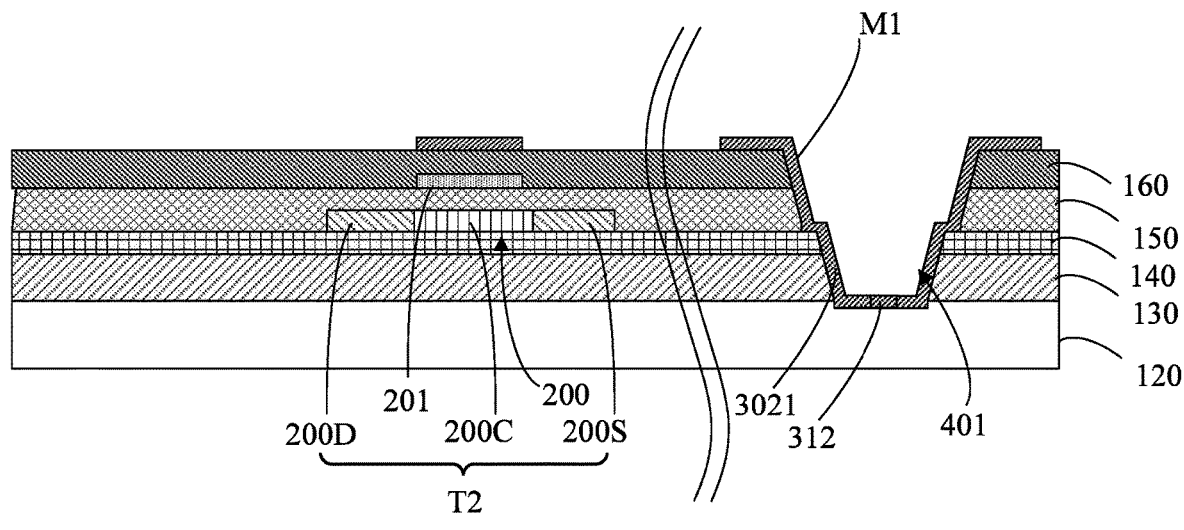
Figure 12:
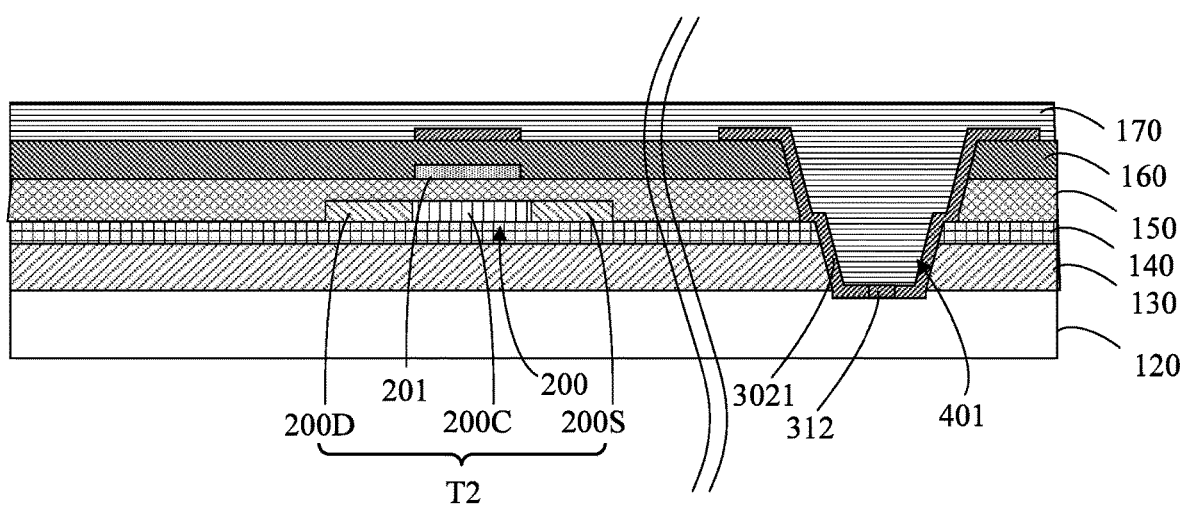
Figure 13:
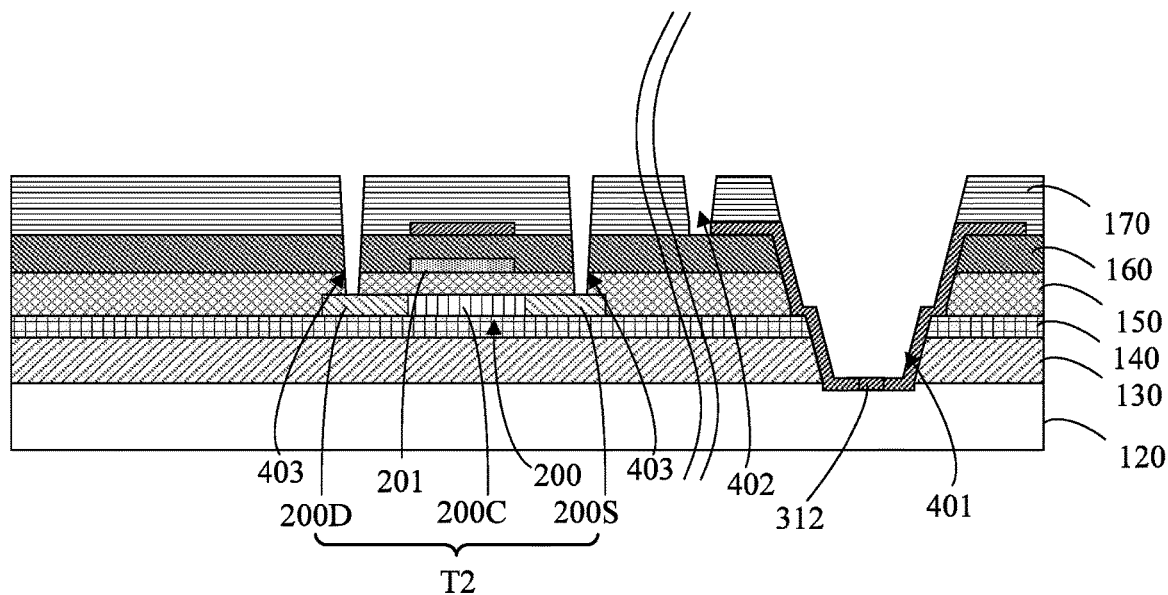
Figure 14:
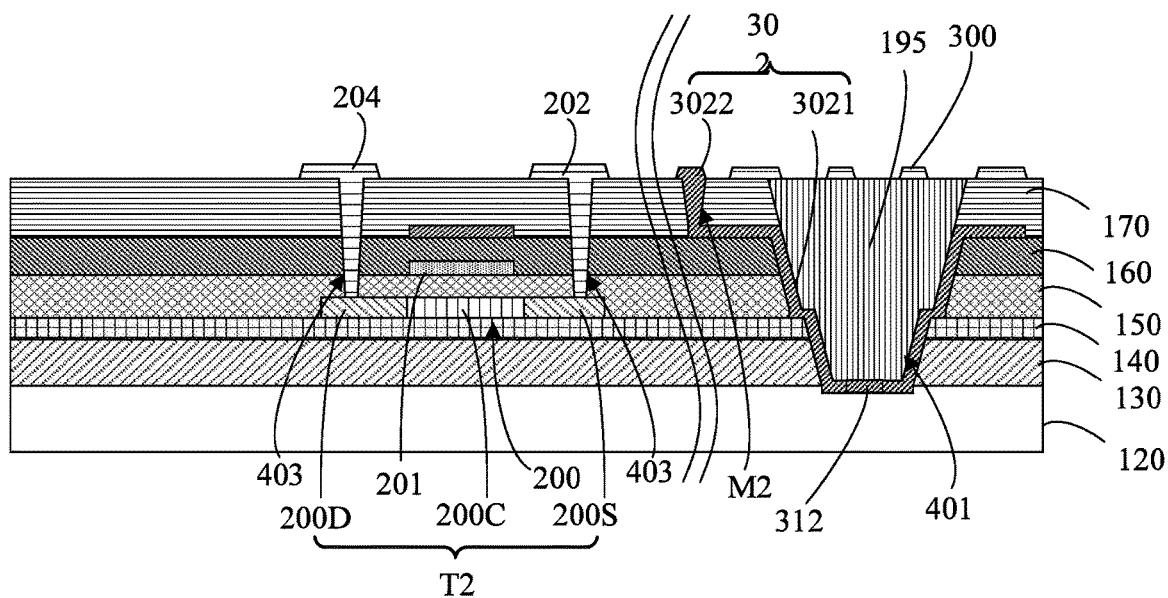
Figure 15:
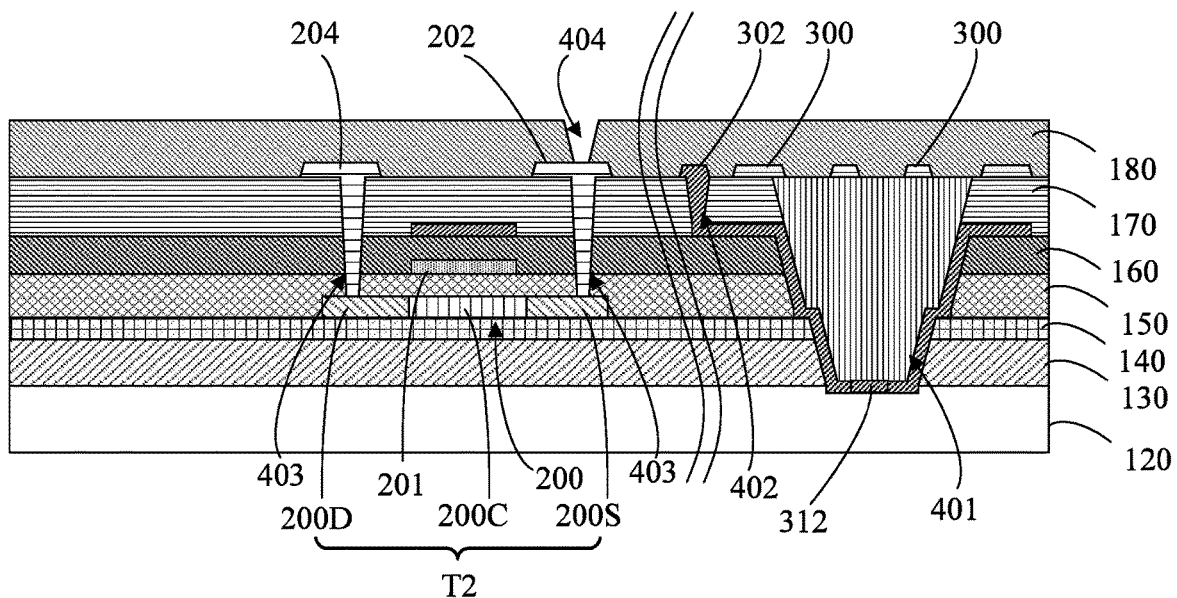
Figure 16:
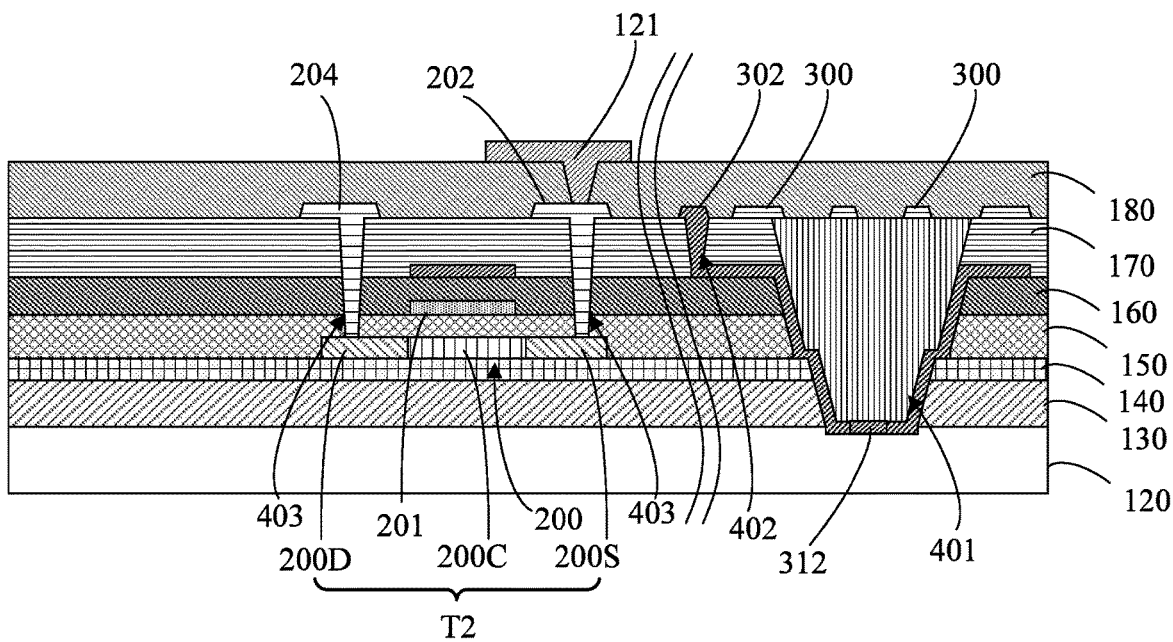
Figure 17:
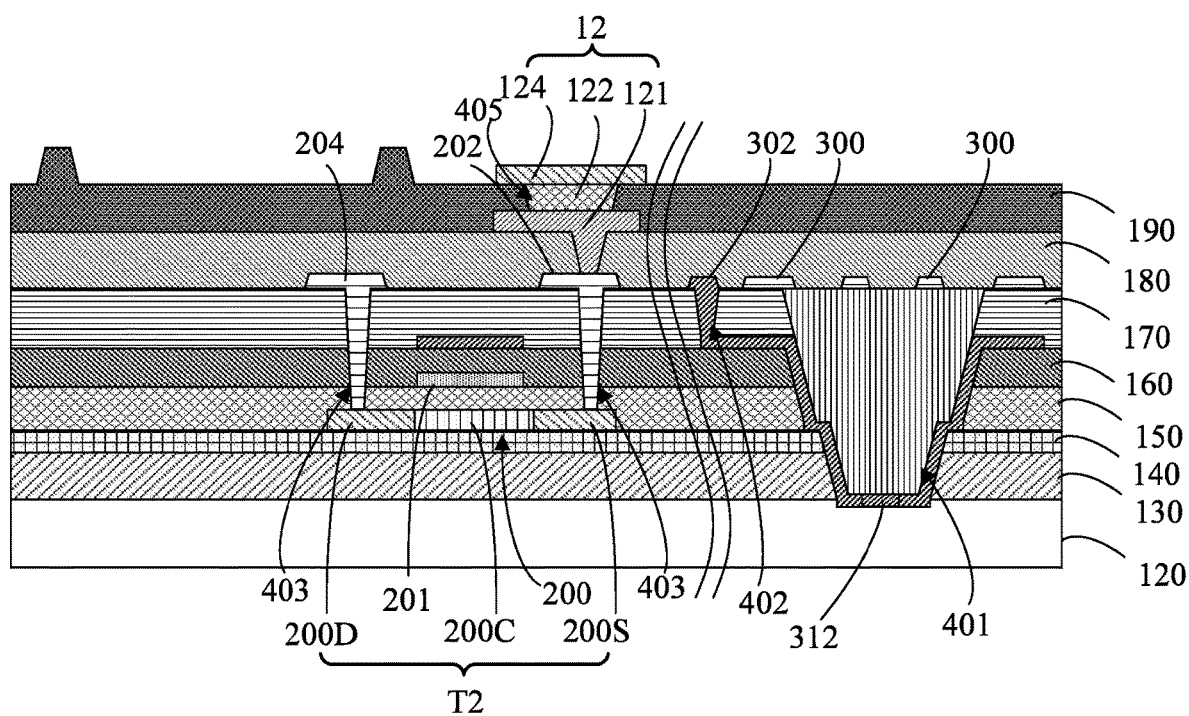

Please refer to FIG. 4 to FIG. 17 illustrating a method of forming a flexible organic light-emitting diode (OLED) device 10 as illustrated in FIG. 3 according a second embodiment of the present disclosure. As illustrated in FIG. 4, a flexible substrate 120 is formed. As illustrated in FIG. 5, an inorganic layer 130 and a buffer layer 140 are sequentially formed on the flexible substrate 120. As illustrated in FIG. 6, an active layer 200 of the driving transistor T2 is formed on the buffer layer 140. The active layer 200 includes a source area 200S, a drain area 200D, and a channel area 200C between the source area 200S and the drain area 200D. As illustrated in FIG. 7, a first gate insulating layer 150 is formed on the buffer layer 140. As illustrated in FIG. 8, a gate 201 (i.e., a controlling electrode) of the driving transistor T2 is formed on the first gate insulating layer 150. As illustrated in FIG. 9, a second gate insulating layer 160 is formed on the first gate insulating layer 150. As illustrated in FIG. 10, the inorganic layer 130, the buffer layer 140, the first gate insulating layer 150, and the second gate insulating layer 160 are etched to form a first hole 401. Specifically, at this block, at first, the first gate insulating layer 150 and the second gate insulating layer 160 are etched to simultaneously form a first primary hole 4011. Next, the inorganic layer 130 and the buffer layer 140 are etched to form a first auxiliary hole 4012. The first primary hole 4011 and the first auxiliary hole 4012 form the first hole 401. As illustrated in FIG. 11, a first metallic layer M1 is etched to form a first segment 3021 of a driving voltage lead 302 and a driving transmitting pad 312. The first segment 3021 of the driving voltage lead 302 is connected to the driving transmitting pad 312 through the first hole 401. As illustrated in FIG. 12, an inter-layer dielectric (ILD) layer 170 is formed on the second gate insulating layer 160. As illustrated in FIG. 13, the ILD layer 170 is etched to form the second hole 402. The first gate insulating layer 150, second gate insulating layer 160 and the ILD layer 170 are etched to form a third hole 403. As illustrated in FIG. 14, an insulating layer 195 is deposited, and the insulating layer 195 is etched so that the insulating layer 195 fills the first hole 401 up. Next, a second metallic layer M2 is etched to form a second segment 3022 of the driving voltage lead 302, a data voltage lead 300, and a source 202 and a drain 204 of the driving transistor T2 (i.e., outputting electrodes). The second segment 3022 is connected to the first segment 3021 through the second hole 403. The source 202 is connected to the active layer 200 through the third hole 403. As illustrated in FIG. 15, a passivation layer 180 is formed on the ILD layer 170, and the ILD layer 170 is etched to form a fourth hole 404. As illustrated in FIG. 16, a third metallic layer M3 which is etched and formed on the passivation layer 180 is etched to form an anode layer 121. The anode layer 121 is connected to the source 202 through the fourth hole 404. As illustrated in FIG. 17, a pixel definition layer 190 is formed on the passivation layer 180, and then the pixel definition layer 190 is etched to form a fifth hole 405. Afterwards, a light-emitting layer 122 of the OLED 12 and a cathode layer 144 of the OLED 12 are sequentially formed on the anode layer 121.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A flexible organic light-emitting diode (OLED) device having an active area and an inactive area, comprising:
    a flexible substrate;
    a buffer layer, arranged on the flexible substrate;
    an inorganic layer, arranged on the buffer layer;
    a first gate insulating layer, arranged on the inorganic layer;
    a second gate insulating layer, arranged on the first gate insulating layer;
    an inter-layer dielectric (ILD) layer, arranged on the second gate insulating layer;
    a passivation layer, arranged on the ILD layer;
    a pixel definition layer (PDL), arranged on the passivation layer;
    a driving transistor, arranged in the active area, comprising a controlling electrode and an outputting electrode, and configured to receive data voltage and driving voltage;
    an OLED, arranged in the active area, comprising an anode layer, a cathode layer, and a light-emitting layer; the light-emitting layer arranged between the anode layer and the cathode layer and configured to produce light based on a difference between the data voltage and the driving voltage;
    a data voltage lead, connected to the controlling electrode of the driving transistor; wherein the data voltage lead arranged on the ILD layer in the inactive area, and the data voltage lead corresponding to a bendable area of the inactive area located on the passivation layer; and
    a driving voltage lead, connected to the outputting electrode of the driving transistor and a driving voltage terminal wherein the driving voltage lead is connected to the driving voltage terminal through a first hole which penetrates the second gate insulating layer, the first gate insulating layer, the inorganic layer, and the buffer layer, and through a second hole which penetrates the ILD layer.

2. The flexible OLED device of claim 1, wherein the driving transistor further comprises an active layer; the active layer is arranged on the buffer layer; the controlling electrode is arranged on the first gate insulating layer; the outputting electrode is connected to the active layer through a third hole which penetrates the ILD layer, the second gate insulating layer, and the first gate insulating layer.

3. The flexible OLED device of claim 1, wherein the anode layer is connected to the outputting electrode through a fourth hole which penetrates passivation layer; the anode layer is configured to receive the driving voltage.

4. The flexible OLED device of claim 1, wherein the flexible substrate is fabricated by polyimide (PI).

5. The flexible OLED device of claim 1, wherein the inorganic layer may be fabricated from either silicon oxide (SiOx) or silicon nitride (SiNx).

6. A method of forming a flexible organic light-emitting diode (OLED) device, comprising:
    forming a flexible substrate;
    forming an inorganic layer and a buffer layer on the flexible substrate sequentially;
    forming an active layer of a driving transistor on the buffer layer;
    forming a first gate insulating layer on the buffer layer;
    forming a controlling electrode of the driving transistor on the first gate insulating layer;
    forming a second gate insulating layer on the first gate insulating layer;
    etching the buffer layer, the first gate insulating layer, and the second gate insulating layer to form a first hole;
    etching a first metallic layer to form a first segment of a driving voltage lead; connecting the first segment of the driving voltage lead to a driving voltage terminal through the first hole;
    forming an inter-layer dielectric (ILD) layer on the second gate insulating layer;
    etching the ILD layer to form a second hole and the third hole, and etching the first gate insulating layer, the second gate insulating layer and the ILD layer to form a third hole;
    etching a second metallic layer to form a second segment of the driving voltage lead, a data voltage lead, and an outputting electrode of the driving transistor; connecting the second segment of the driving voltage lead to the first segment of the driving voltage lead through the second hole; connecting the outputting electrode of the driving transistor to the active layer through the third hole;

forming a passivation layer on the ILD layer; and forming an OLED on the passivation layer wherein an anode layer of the OLED is connected to the outputting electrode of the driving transistor.

7. The method of claim 6, wherein the step of forming the OLED on the passivation layer and connecting the anode layer of the OLED to the outputting electrode comprises:

etching the passivation layer to form a fourth hole;

etching a third metallic layer of the passivation layer to form the anode layer; connecting the anode layer to the outputting electrode through the fourth hole;

forming a pixel definition layer (PDL) on the passivation layer;

etching the passivation layer to form a fifth hole; and forming a light-emitting layer of the OLED and a cathode layer of the OLED on the anode layer sequentially.

8. The method of claim 6, wherein the step of etching the buffer layer, the first gate insulating layer, and the second gate insulating layer to form the first hole comprises:

etching the first gate insulating layer and the second gate insulating layer to form a primary hole; and etching the buffer layer to form a first auxiliary hole, wherein the first hole is formed with the first primary hole and the first auxiliary hole.

9. The method of claim 6, wherein the flexible OLED device comprises an active area and an inactive area; the driving transistor and the OLED are arranged in the active area; the driving voltage lead and the data voltage lead are arranged in the inactive area.

10. The method of claim 6, wherein the flexible substrate is fabricated by polyimide (PI).

* * * * *